US012588191B2

(12) United States Patent
Zhang

(10) Patent No.: US 12,588,191 B2
(45) Date of Patent: Mar. 24, 2026

(54) SEMICONDUCTOR DEVICE AND METHOD OF FABRICATING THE SAME

(71) Applicant: Fujian Jinhua Integrated Circuit Co., Ltd., Quanzhou City (CN)

(72) Inventor: Janbo Zhang, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 283 days.

(21) Appl. No.: 18/241,989

(22) Filed: Sep. 4, 2023

(65) Prior Publication Data

US 2024/0357797 A1 Oct. 24, 2024

(30) Foreign Application Priority Data

Apr. 23, 2023 (CN) .......................... 202310443431.4
Apr. 23, 2023 (CN) .......................... 202320933657.8

(51) Int. Cl.
*H10B 12/00* (2023.01)

(52) U.S. Cl.
CPC ....... *H10B 12/482* (2023.02); *H10B 12/0335* (2023.02); *H10B 12/485* (2023.02)

(58) Field of Classification Search
CPC .............. H10B 12/482; H10B 12/0335; H10B 12/485; H10B 12/315
See application file for complete search history.

(56) References Cited

U.S. PATENT DOCUMENTS

| | | | |
|---|---|---|---|
| 8,648,423 B2 * | 2/2014 | Han | H10D 84/038 |
| | | | 257/774 |
| 8,815,687 B2 | 8/2014 | Park et al. | |
| 8,835,275 B2 | 9/2014 | Park et al. | |
| 8,889,543 B2 | 11/2014 | Baek et al. | |
| 11,152,371 B2 | 10/2021 | Iwaki | |
| 11,362,031 B2 | 6/2022 | Lee et al. | |
| 2019/0221570 A1 * | 7/2019 | Liu | H10B 12/482 |

* cited by examiner

*Primary Examiner* — Matthew L Reames
(74) *Attorney, Agent, or Firm* — Winston Hsu

(57) ABSTRACT

The present disclosure provides a semiconductor memory device and a method of fabricating the same, including a substrate, a plurality of bit lines, a bit line contact, a spacer, a liner layer, and a storage node contact. The bit lines are separately disposed on the substrate. The bit line contact is disposed below one of the bit lines to extend into one active area. The spacer is disposed on sidewalls of each of the bit lines and the bit line contact. The liner layer is disposed on the substrate along an outer periphery of the bit line contact, wherein the liner layer comprises a first portion embedded in the one of the bit line, between the bit line contact and the one of the bit lines in an extending direction of the bit lines. The storage node contact and the bit lines are alternately arranged with each other.

20 Claims, 14 Drawing Sheets

SEMICONDUCTOR DEVICE AND METHOD OF FABRICATING THE SAME

BACKGROUND OF THE INVENTION

1. Field of the Invention

The present disclosure generally relates to a semiconductor device and a method of fabricating the same, and more particularly, to a semiconductor memory device and a method of fabricating the same.

2. Description of the Prior Art

With the trend of miniaturization of various electronic products, the design of semiconductor memory devices must meet the requirements of high integration and high density. For a dynamic random access memory (DRAM) having recessed gate structures, because the carrier channel of which is relatively long in the same semiconductor substrate compared with that of the DRAM without recessed gate structures, the leakage current from the capacitor structure in the DRAM can be reduced. Therefore, the DRAM having recessed gate structures has gradually replaced DRAM only having planar gate structures under the current mainstream development trend. Generally, the DRAM having recessed gate structures is constructed by a large number of memory cells which are arranged to form an array area, and each of the memory cells can be used to store information. Each memory cell may include a transistor element and a capacitor element connected in series, which is configured to receive voltage information from word lines (WL) and bit lines (BL). In order to satisfy the requirements of advanced products, the density of memory cells in the array area must be further increased, which increases the difficulty and complexity of related fabricating processes and designs. Therefore, the present technology needs further improvement to effectively improve the efficiency and reliability of related memory devices.

SUMMARY OF THE INVENTION

One of the objectives of the present disclosure provides a semiconductor memory device and a method of fabricating the same, in which a liner layer is additionally disposed at an outer periphery of the bit line contact, to shrink the diameter of the bit line contact opening, and to improve the expansion issue of the bit line contact opening caused by over-etching, and enhancing the structural reliability of the bit line contact thereby. Accordingly, the fabricating method of the present disclosure is allowable to form a semiconductor memory device with more reliable components, to effectively avoid the possible structural defects caused by continuously shrinking density of the components.

To achieve the purpose described above, one embodiment of the present disclosure provides a semiconductor memory device including a substrate, a plurality of bit lines, a bit line contact, a spacer, a liner layer, and a storage node contact. The substrate includes a plurality of active areas and a shallow trench isolation. The bit lines are separately disposed on the substrate. The bit line contact is disposed below one of the bit lines to extend into one of the active areas. The spacer is disposed on sidewalls of each of the bit lines and the bit line contact. The liner layer is disposed on the substrate along an outer periphery of the bit line contact, wherein the liner layer comprises first portion embedded in the one of the bit line. The first portion is disposed between the bit line contact and the one of the bit lines in an extending direction of the bit lines. The storage node contact is disposed on the one of the active areas, and the storage node contact and the bit lines are alternately arranged with each other.

To achieve the purpose described above, one embodiment of the present disclosure provides a semiconductor memory device including a substrate, a plurality of bit lines, a bit line contact, a spacer, and a storage node contact. The substrate includes a plurality of active areas and a shallow trench isolation. The bit lines are separately disposed on the substrate, with each of the bit lines including a conductive layer and a capping layer stacked from bottom to top, and with a top portion of the capping layer including a plurality of protrusions. The bit line contact is disposed below one of the bit lines to extend into one of the active areas, wherein one of the protrusions is disposed around the bit line contact. The spacer is disposed on sidewalls of each of the bit lines and the bit line contact. The storage node contact is disposed on the one of the active areas, and the storage node contact and the bit lines are alternately arranged with each other.

To achieve the purpose described above, one embodiment of the present disclosure provides a method of fabricating a semiconductor memory device including the following steps. Firstly, a substrate is provided, and the substrate includes a plurality of active areas and a shallow trench isolation. Next, a plurality of bit lines is separately formed on the substrate. Then, a bit line contact is formed below one of the bit lines, with the bit line contact being extended into one of the active areas, and a spacer is formed on sidewalls of each of the bit lines and the bit line contact. After that, a liner layer is formed on the substrate along an outer periphery of the bit line contact, wherein the liner layer includes a first portion embedded in the one of the bit line, and the first portion is disposed between the bit line contact and the one of the bit lines in an extending direction of the bit lines. Then, a storage node contact is formed on the one of the active areas, and the storage node contact and the bit lines are alternately arranged with each other.

These and other objectives of the present invention will no doubt become obvious to those of ordinary skill in the art after reading the following detailed d description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 1 to FIG. 16 are schematic diagrams illustrating a fabricating method of a semiconductor memory device according to a first embodiment in the present disclosure, wherein:

FIG. 1 is a schematic top view of a semiconductor memory device after forming a mask structure;

FIG. 2 is a schematic cross-sectional view taken along a cross-line A-A' in FIG. 1;

FIG. 3 is a schematic cross-sectional view of a semiconductor memory device after forming a liner material layer;

FIG. 4 is a schematic top view of a semiconductor memory device after forming a contact opening;

FIG. 5 is a schematic cross-sectional view taken along a cross-line A-A' in FIG. 4;

FIG. 6 is a schematic cross-sectional view of a semiconductor memory device after forming a bit line contact;

FIG. 7 is a schematic top view of a semiconductor memory device after forming a capping layer;

FIG. 8 is a schematic cross-sectional view taken along a cross-line A-A' in FIG. 7;

FIG. 9 is a schematic cross-sectional view taken along a cross-line B-B' in FIG. 7;

FIG. 10 is a schematic top view of a semiconductor memory device after forming a bit line;

FIG. 11 is a schematic cross-sectional view taken along a cross-line A-A' in FIG. 10;

FIG. 12 is a schematic cross-sectional view taken along a cross-line B-B' in FIG. 10;

FIG. 13 is a schematic top view of a semiconductor memory device after forming a spacer;

FIG. 14 is a schematic cross-sectional view taken along a cross-line A-A' in FIG. 13;

FIG. 15 is a schematic top view of a semiconductor memory device after forming a plug; and FIG. 16 is a schematic cross-sectional view taken along a cross-line A-A' in FIG. 15.

FIG. 17 to FIG. 18 are schematic diagrams illustrating a fabricating method of a semiconductor memory device according to a second embodiment in the present disclosure, wherein:

FIG. 17 is a schematic top view of a semiconductor memory device after forming a plug; and FIG. 18 is a schematic cross-sectional view taken along a cross-line A-A' in FIG. 17.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Please refer to FIG. 1 to FIG. 16, illustrating schematic diagrams of a fabricating method of a semiconductor memory device 100 according to the first embodiment in the present disclosure, wherein FIG. 1, FIG. 4, FIG. 7, FIG. 10, FIG. 13, and FIG. 15 respectively show a schematic top view of the semiconductor memory device 100 during the fabricating processes, and other drawings respectively show a cross-sectional view of the semiconductor memory device 100 along different cross-lines during the fabricating processes. The semiconductor memory device 100 for example includes a substrate 110, such as a silicon substrate, a silicon containing substrate (such as SiC or SiGe), or a silicon-on-insulator (SOI) substrate. The substrate 110 further includes at least one shallow trench isolation (STI) 112 disposed therein to define a plurality of active areas (AAs) 114 in the substrate 110. That is, the shallow trench isolation 112 is disposed around the active areas 114, to be disposed at the outer periphery of the active areas 114.

Figure 1:
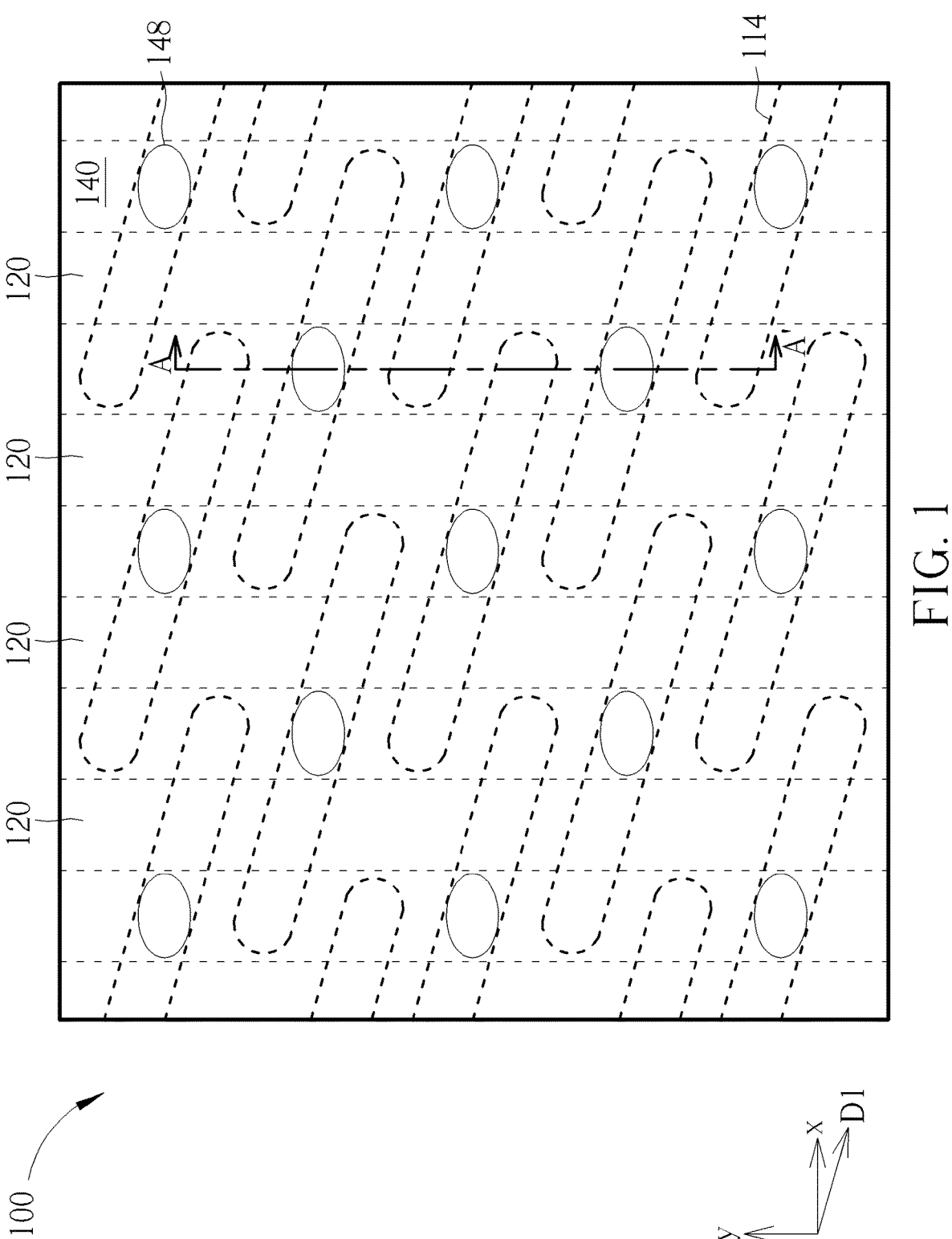

Precisely speaking, the active areas 114 are parallel with each other, and separately extended along a first direction D1, with each of the active areas 114 having the same length (not shown in the drawings) in the first direction D1, to together arrange in a particular arrangement, such as an array arrangement as shown in FIG. 1, but not limited thereto. In one embodiment, the formation of the active areas 114 may be accomplished but is not limited to the following processes. Firstly, a bulk silicon substrate (not shown in the drawings) is provided, and a mask layer (not shown in the drawings) is formed on the bulk silicon substrate, with the mask layer including plural patterns for defining the active areas 114, and an etching process is then performed through the mask layer, to partially remove the bulk silicon substrate to form the active areas 114 and a shallow trench (not shown in the drawings) surrounding the active areas 114. Following these, an insulating material (not shown in the drawings) such as including silicon oxide, silicon nitride or silicon oxynitride is filled in the shallow trench, to form the shallow trench isolation 112. Accordingly, the substrate 110 is formed thereby to have the active areas 114 and the shallow trench isolation 112 having a top surface thereof being coplanar with the top surface of the substrate 110. Also, in another embodiment, mask patterns for defining the first active areas 114 may be fabricated through a self-aligned double patterning (SADP) process or a self-aligned reverse patterning (SARP) process, but not limited thereto.

Further in view of FIG. 1, the semiconductor memory device 110 further includes a plurality of buried gate structure 120 embedded in the substrate 110, with each of the gate structures 140 parallel extended along a y-direction, to intersect the active areas 114 and the shallow trench isolation 112 at the same time. Precisely speaking, each of the gate structures 120 includes an interface dielectric layer (not shown in the drawings), a gate dielectric layer (not shown in the drawings), a gate electrode (not shown in the drawings) and a covering layer (not shown in the drawings) stacked from bottom to top. The covering layer of each of the gate structures 120 has a top surface being coplanar with the top surface of the substrate 110, so that, the gate structures 120 will therefore serve as a plurality of buried word lines (BWL) of the semiconductor memory device 100 for accepting or transmitting the voltage signals from memory cells (not shown in the drawings) formed in the subsequent processes. In one embodiment, the fabrication of the gate structures 120 includes but is not limited to the following steps. Firstly, a plurality of trenches (not shown in the drawings) is formed in the substrate 110, and then, the interface dielectric layer and a gate dielectric material layer (not shown in the drawings) which are entirely covering surfaces of each of the trenches, and a gate electrode layer (not shown in the drawings) which is filled up each of the trenches 141, are sequentially formed in the trenches. Following these, the gate dielectric layer covering bottom surfaces of each of the trenches, and the gate electrode filled up the bottom of each of the trenches are formed after etching back the gate electrode layer and the gate dielectric material layer, and the covering layer filled up the top of each of the trenches is then formed in the trenches.

Figure 2:
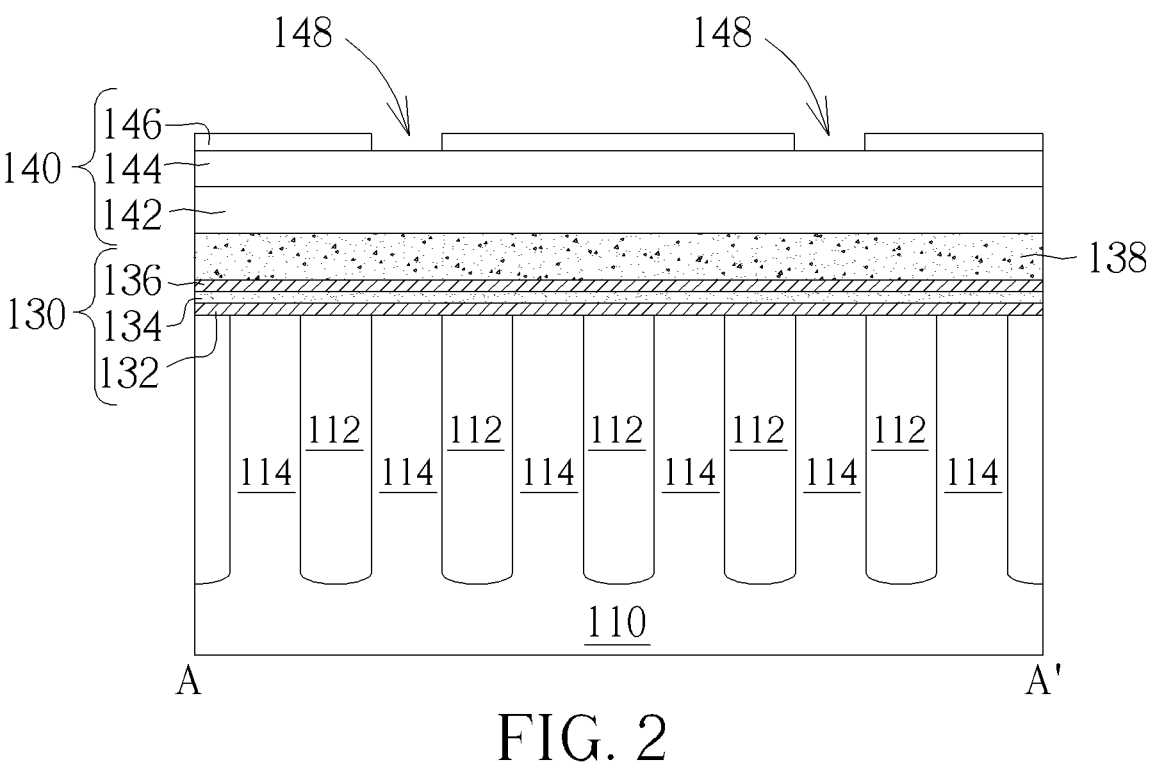
Figure 4:
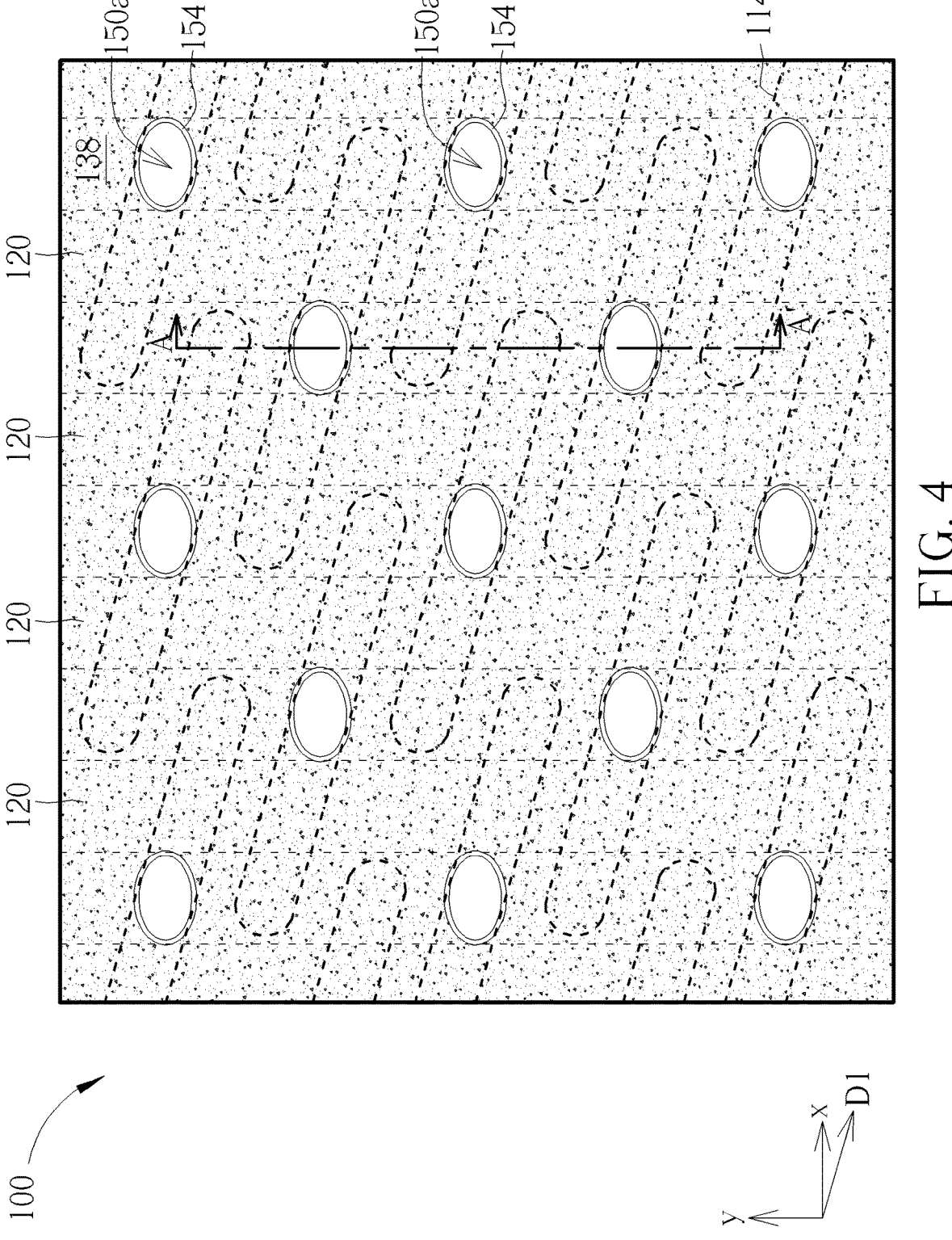
Figure 5:
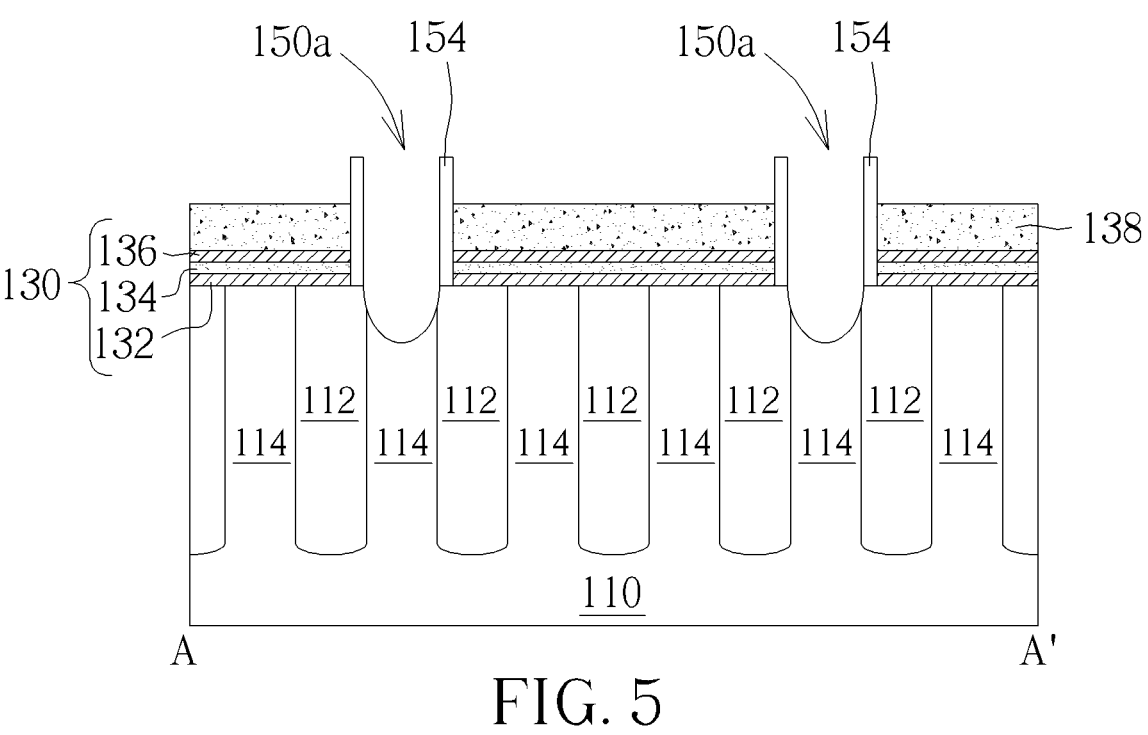
Figure 6:
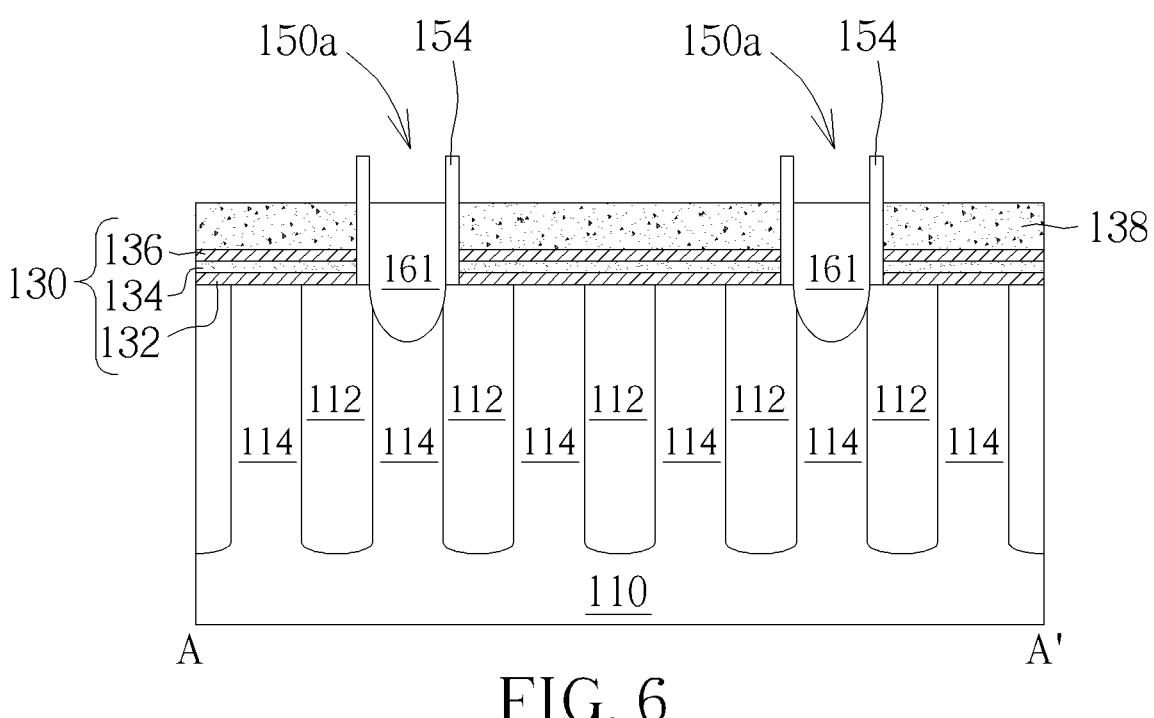

Furthermore, as shown in FIG. 2, the semiconductor memory device 100 further includes a dielectric layer 130 disposed on the substrate 110, with the dielectric layer 130 directly covering the top surface of each word line (namely, the gate structure 120, not shown in FIG. 2). In one embodiment, the dielectric layer 130 preferably includes a multilayer structure for example including an oxide layer nitride 132—a layer 134—an oxide layer 136 (oxide-nitride-oxide, ONO) structure (not shown in the drawings), but not limited thereto. Then, a bottom semiconductor layer 138 and a mask structure 140 are sequentially formed on the substrate 110, to form a plurality of contact openings 150a as shown in FIG. 4 to FIG. 6. Precisely speaking, the mask structure 140 for example includes a sacrificial layer (for example including an organic dielectric material) 142, a silicon containing hard mask (SHB) layer 144, and a patterned photoresist layer 146, wherein the patterned photoresist layer 146 includes at least one pattern 148 for defining at least one contact opening 150a. In one embodiment, the bottom semiconductor layer 138 for example includes a semiconductor material, preferably including a material having an etching selectivity related to the sacrificial layer 142, such as a silicon containing material like doped polysilicon or doped amorphous silicon, but not limited thereto.

Figure 3:
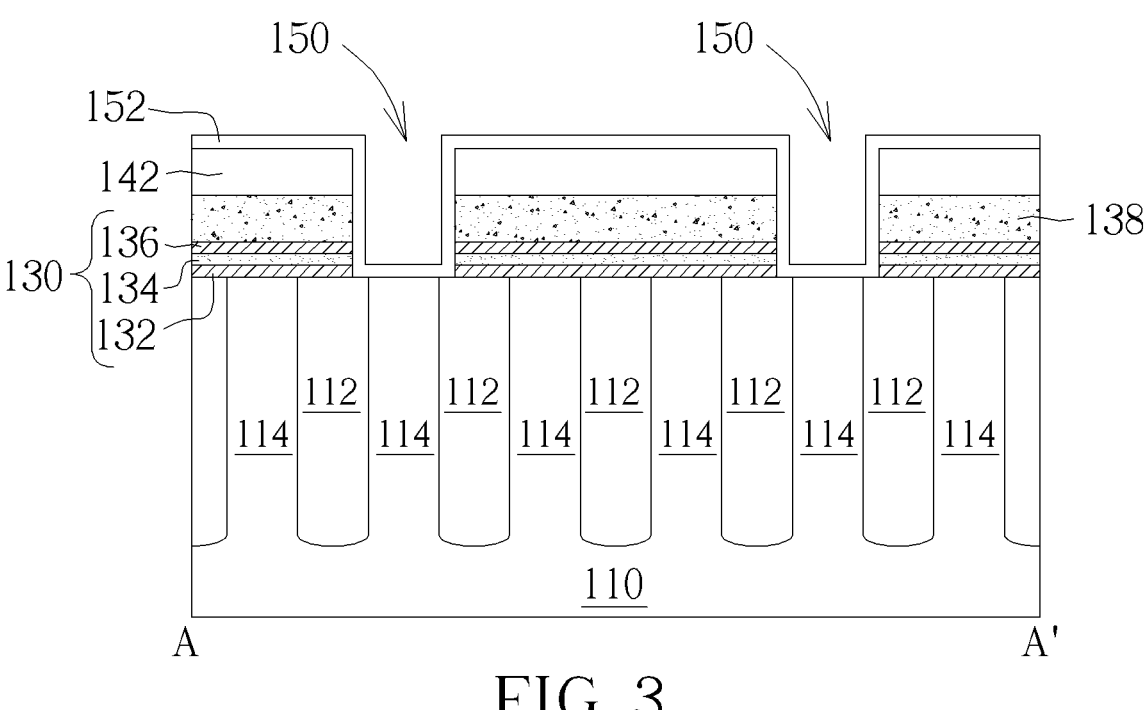

After that, an etching process is performed through the patterned photoresist layer 146, to transfer the pattern 148 of the patterned photoresist layer 146 into the silicon containing hard mask layer 144, the sacrificial layer 142, the bottom semiconductor layer 138 and the dielectric layer 130 underneath, to form a plurality of openings 150 as shown in FIG. 3 to aligned with each active area 144 respectively. Also, after forming the openings 150, the patterned photoresist layer 146 and the silicon containing hard mask layer 144 are completely removed. Next, further in view of FIG. 3, a liner material layer 152 is formed on the substrate 110, conformally covering the exposed surfaces of the sacrificial layer 142, the bottom semiconductor layer 138 and the openings 150. In one embodiment, the liner material layer 152 for example includes a material like silicon oxide or silicon oxynitride, and preferably includes a material the same as the shallow trench isolation 112 but is not limited thereto. In another embodiment, the liner material layer 152 may also include an insulating material being different from that of the shallow trench isolation 112, such as including silicon nitride or silicon carbonitride.

As shown in FIG. 4 and FIG. 5, another etching process is performed, and a plurality of contact openings 150a is formed by downwardly etching the liner material layer 152 and a portion of the substrate 110 through the profile of the openings 150 as shown in FIG. 3. Meanwhile, the sacrificial layer 142 having a similar material as that of the liner material layer 152 is also removed in the another etching process, to exposed the bottom semiconductor layer 138 underneath. Each of the contact openings 150a is for example between two adjacent ones of the word lines (namely, the gate structures 120), to expose a portion of each active area 114 from the bottom of each contact opening 150. It is noted that, during the another etching process, the liner material layer 152 covering the top surface of the sacrificial layer 142 and covering the bottom surface of the openings 150 is completely removed, and the liner material layer 152 covering sidewalls of the openings 150 is partially removed, to form a plurality of liner layers 154. Accordingly, the liner layers 154 are directly formed on the substrate 110, covering two opposite sidewalls of each of the contact openings 150a, wherein the bottom of each liner layer 154 is partially covered by the bottom semiconductor layer 138, and the top of each liner layer 154 is exposed from the bottom semiconductor layer 138. In other words, a top surface of each liner layer 154 is higher than a top surface of the bottom semiconductor layer 138. Accordingly, each of the liner layers 154 is disposed to surround the sidewall of each contact opening 150a, so that, with the arrangement of the liner layers 154 to effectively control the aperture of each contact opening 150a, thereby avoiding the expansion issues caused by over-etching in the aforementioned etching process.

As shown in FIG. 6, a bit line contact (BLC) 161 is formed in each contact opening 150, with the top surface of the bit line contacts 161 being lower than the top surface of the liner layers 154, and preferably being coplanar with the top surface of the bottom semiconductor layer 138, but not limited thereto. In another embodiment, a bit line contact (not shown in the drawings) having a top surface lower than or higher than the top surface of the bottom semiconductor layer 138 may also be formed optionally. The bit line contacts 161 for example include a conductive material like silicon phosphide (SiP), and preferably include phosphorus with a greater doping concentration, but not limited thereto. The formation of the bit line contact 161 may be carried out but is not limited to the following processes. Firstly, a chemical vapor deposition process is performed, to form a conductive material layer (for example including a conductive material like silicon phosphide) at least filled up each of the contact openings 150a. Next, an etching back process such as a dry etching process is performed, to partially remove the conductive material till being partially filled in each of the contact openings 150a, thereby forming the bit line contacts 161.

Figure 7:
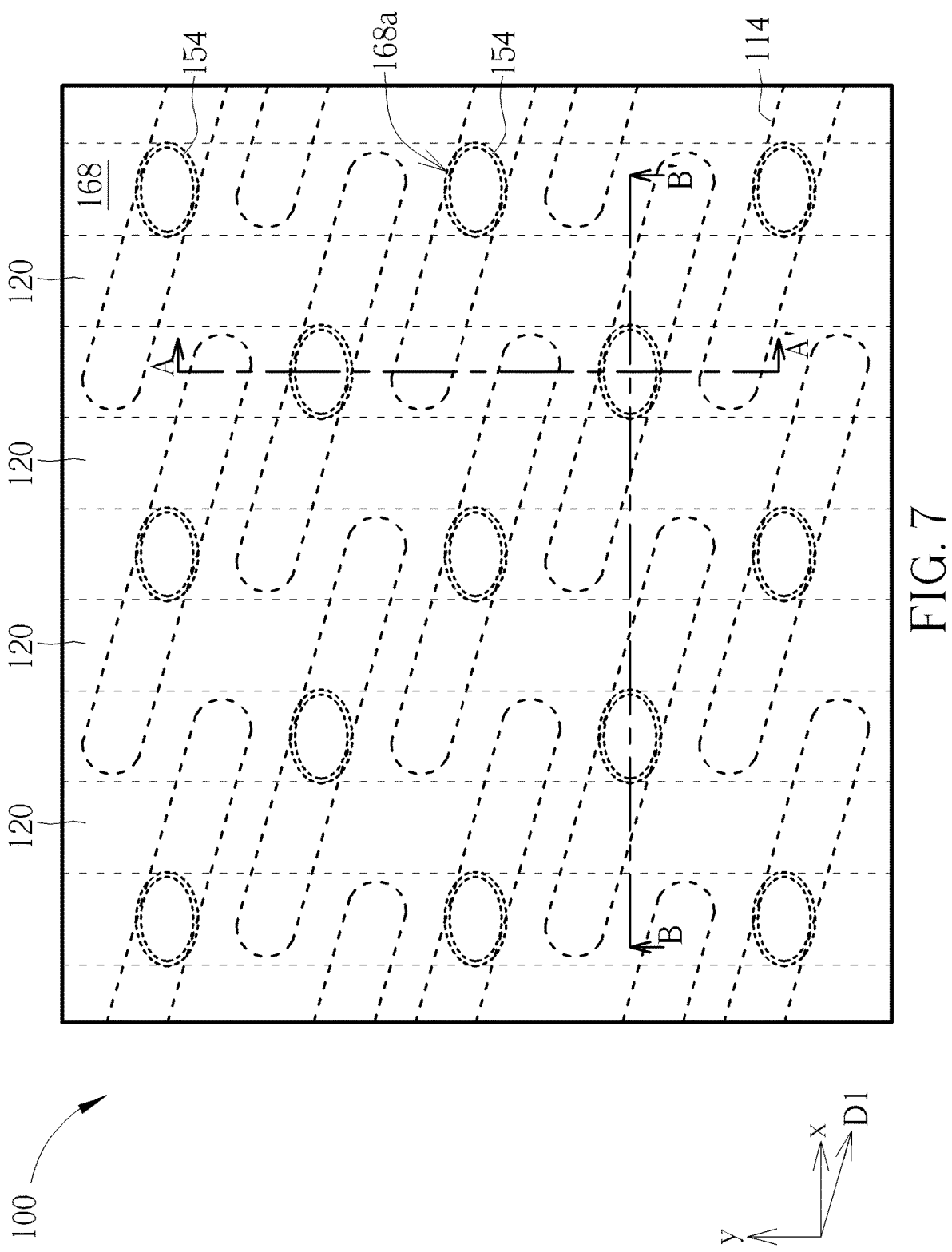
Figure 8:
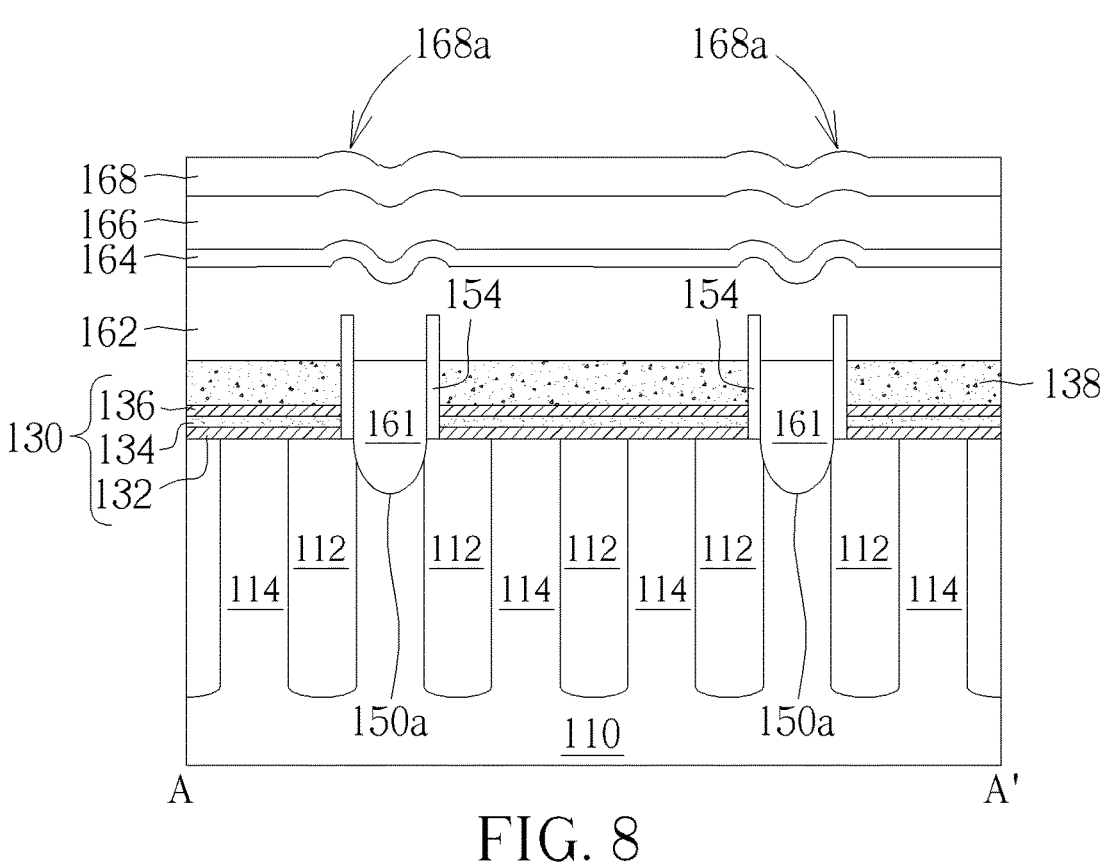
Figure 9:
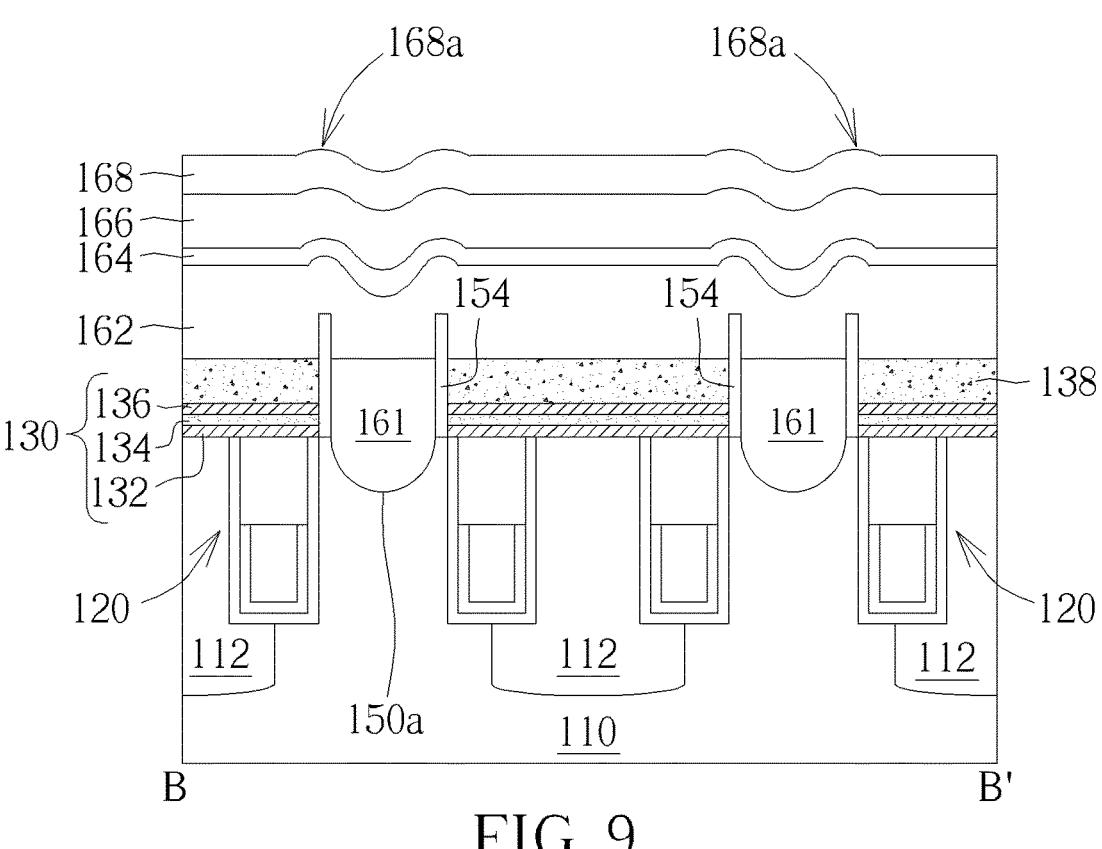

As shown in FIG. 7 to FIG. 9, a semiconductor layer 162 (for example including a material like polysilicon, doped silicon, doped phosphorus, or silicon phosphide), a barrier layer 164 (for example including titanium and/or titanium nitride), a conductive layer 166 (for example including a low-resistant metal like tungsten, aluminum, or copper) and a capping layer 168 (for example including silicon oxide, silicon nitride or silicon oxynitride) are sequentially formed on the substrate 110, to cover the bottom semiconductor layer 138, the liner layers 154 and the bit line contacts 161, with a portion of the semiconductor layer 162 filling in each of the contact openings 150a. It is noted that, since each liner layer 154 is protruded from the top surface of the substrate 110, around the outer periphery of each contact opening 150a, the semiconductor layer 162, the barrier layer 164, the conductive layer 166, and the capping layer 168 stacked sequentially over the liner layers 154 will respectively have corresponding protrusions. Then, each of the semiconductor layer 162, the barrier layer 164, the conductive layer 166 and the capping layer 168 will therefore include a wave profile as being view from a top view (not shown in the drawings), wherein a top surface of the capping layer 168 includes a plurality of protrusions 168a protruding therefrom in a ring-shape as shown in FIG. 7, and each of the protrusions 168a is aligned with each of the liner layers 154, to surround outside each of the contact openings 150a in a direction normal to the substrate 110, as shown in FIG. 8 and FIG. 9.

Figure 10:
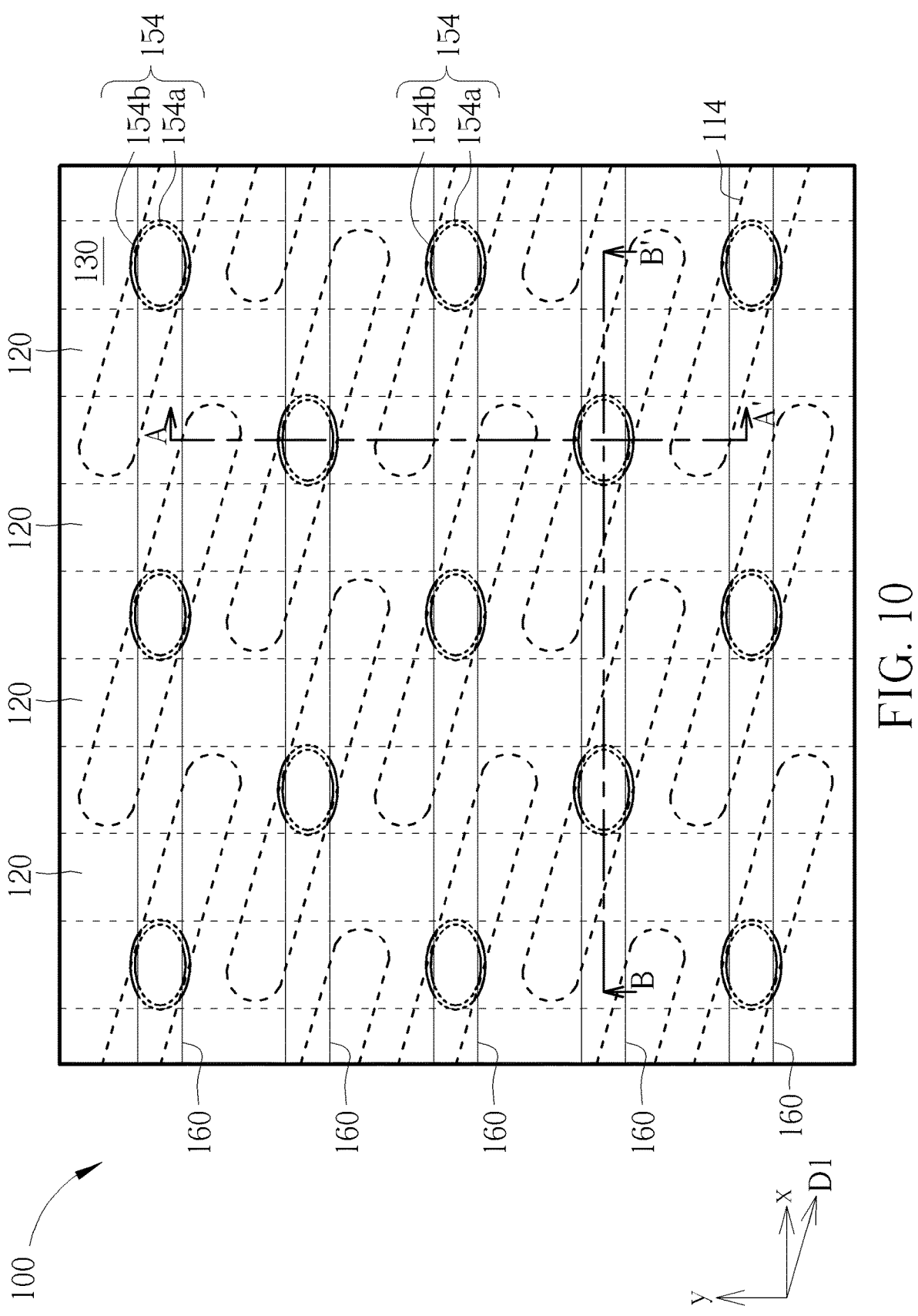
Figure 11:
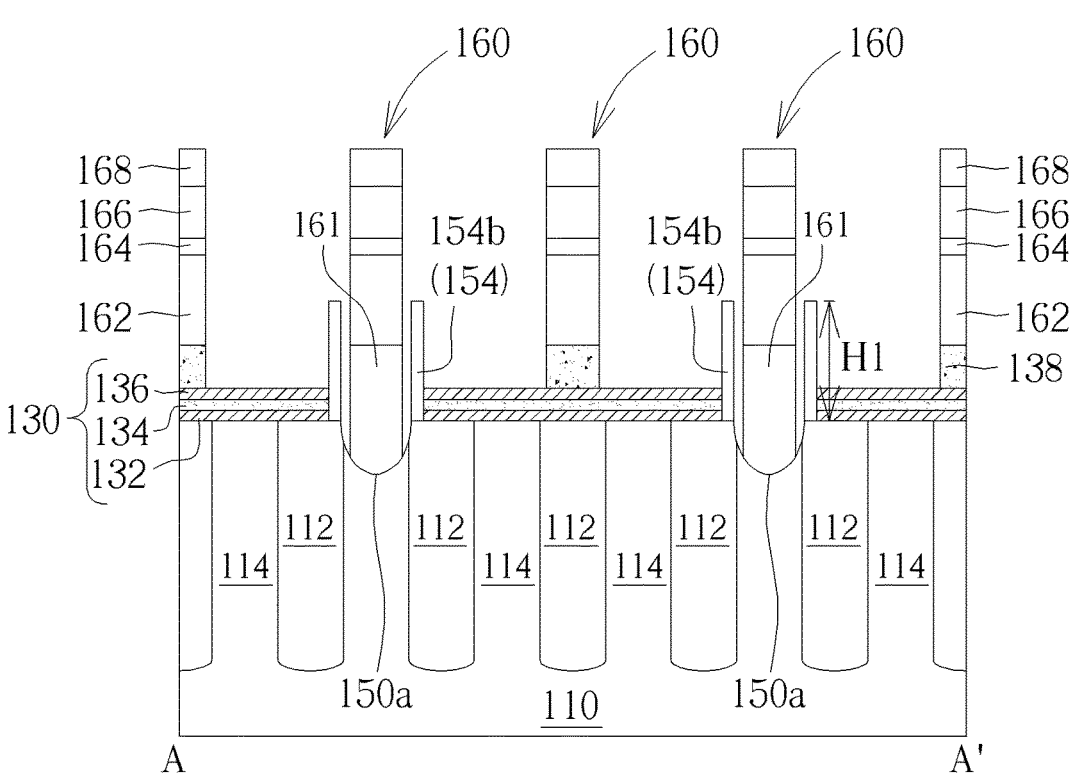
Figure 12:
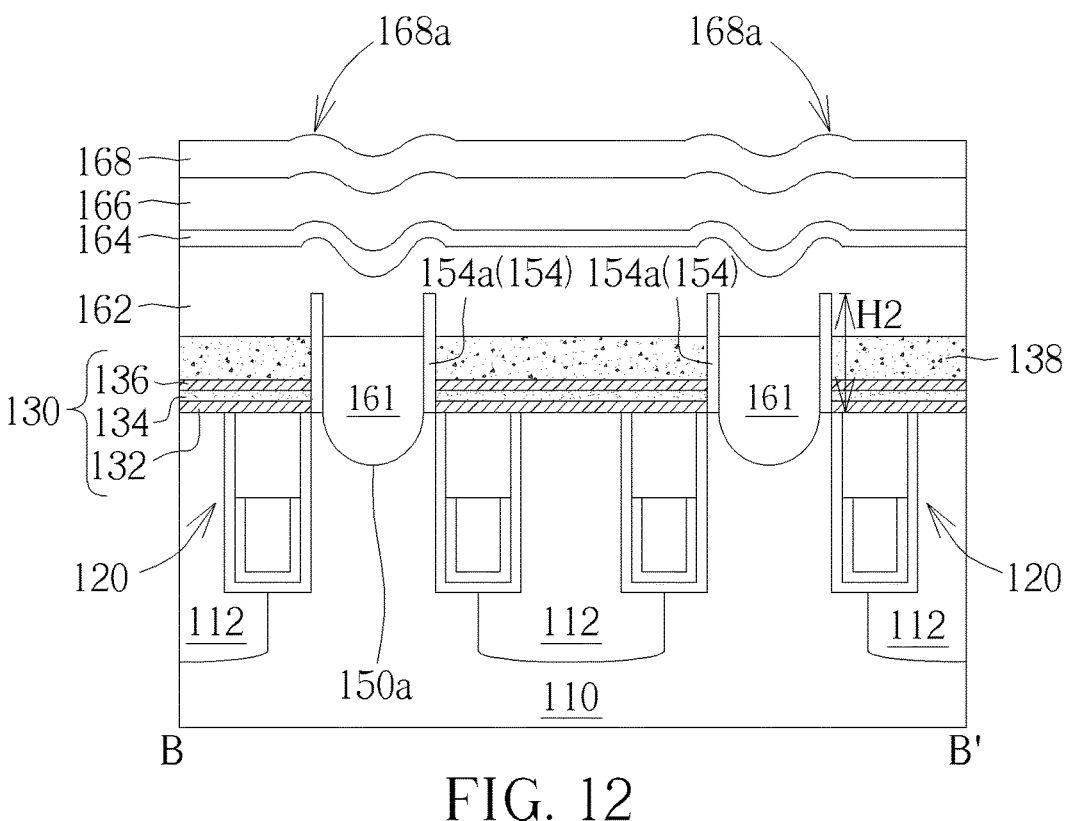

As shown in FIG. 10 to FIG. 12, a patterning process is performed, to pattern the bottom semiconductor layer 138, the semiconductor layer 162, the barrier layer 164, the conductive layer 166, and the capping layer 168 stacked sequentially on the dielectric layer 130, to form a plurality of bit lines 160, with each of the bit lines 160 being parallel with each other and separately extending along the x-direction, to intersect the active areas 114 and the shallow trench isolation 112. The bit lines 160 include a plurality of bit line contacts 161 disposed therebelow, wherein each of the bit line contacts 161 extends into the corresponding active area 114, to electrically connect the transistor disposed within the substrate 110 for accepting or transmitting the voltage signals from the memory cells formed in the subsequent processes.

It is noted that, after forming the bit lines 160, a first portion 154a of each of the liner layers 154 is partially embedded in the bottom semiconductor layer 138 of the bit lines 160, and partially embedded in the semiconductor layer 162 of the bit lines 160. Then, each first portion 154a is disposed between each bit line contact 161 and each bit line 160 in the extending direction (the x-direction) of the bit lines 160, above each active area 114 in the direction normal to the substrate 110, as shown in FIG. 10 and FIG. 12. On the other hand, a second portion 154b of each of the liner layers 154 is exposed after patterning the bottom semiconductor layer 138, the semiconductor layer 162, the barrier layer 164, the conductive layer 166, and the capping layer 168, and each second portion 154b is disposed on the sidewall of each bit line 160 in the direction (the y-direction) normal to the bit lines 160, without directly contacting the sidewall of each bit line 160. Thus, there is a gap (not shown in the drawings) between each second portion 154b and the sidewall of each bit line 160, as shown in FIG. 10 and FIG. 11. Also, each of the second portions 154b includes a relative smaller height H1 extended from the top surface of the substrate 110 along a projection direction of the substrate 110, and each of the first portions 154a includes a relative greater height H2 extended from the top surface of the substrate 110 along a projection direction of the substrate 110 after the patterning process, as the second portions 154b are partially etched during the patterning process. In addition, since each second portion 154b is disposed over the shallow trench isolation 112 in the direction normal to the substrate 110, each second portion 154b may serve as the extension of the shallow trench isolation 112 extended over the top surface of the shallow trench isolation 112, as the liner layer 154 and the shallow trench isolation 112 include the same material, but not limited thereto.

Figure 13:
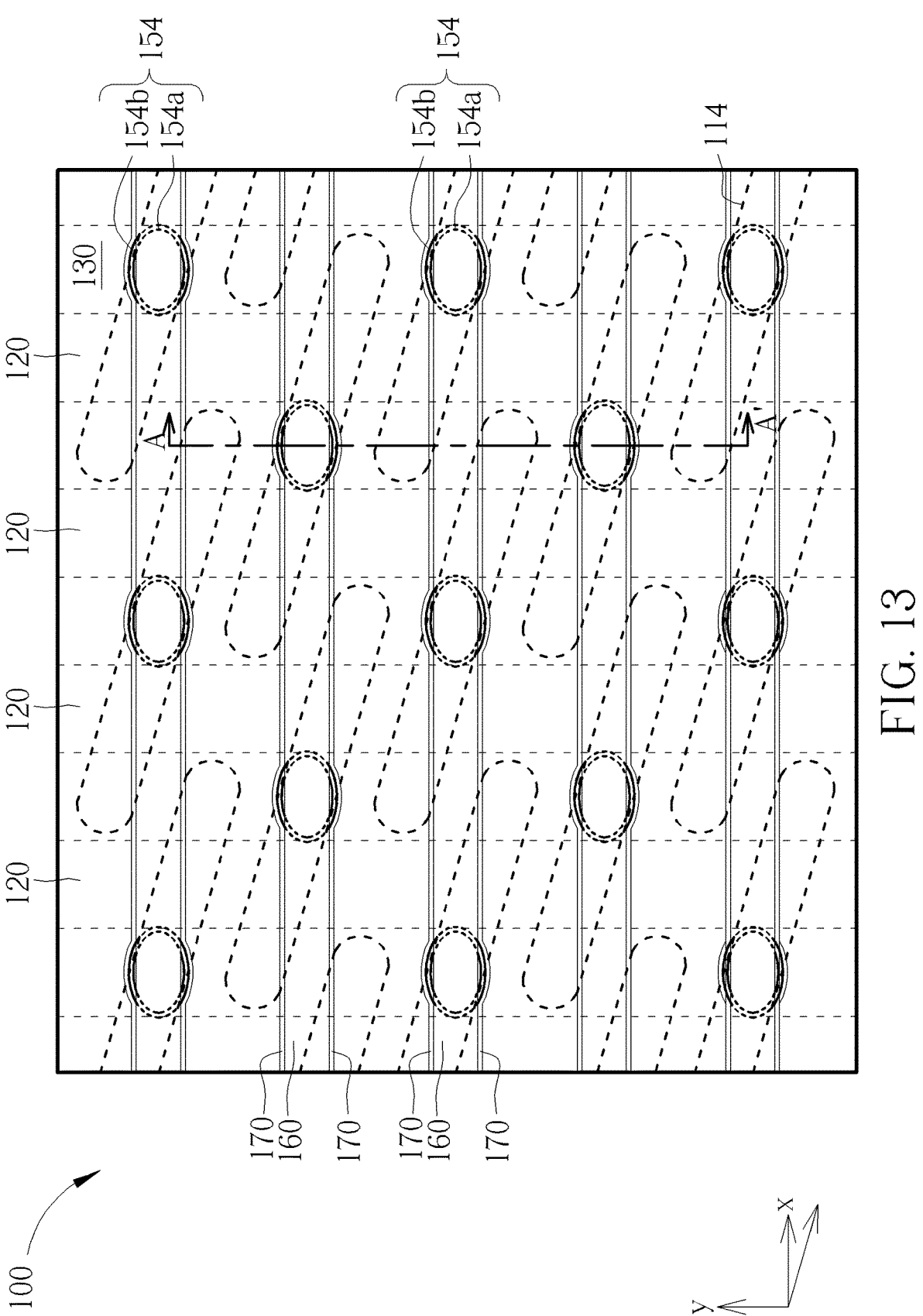
Figure 14:
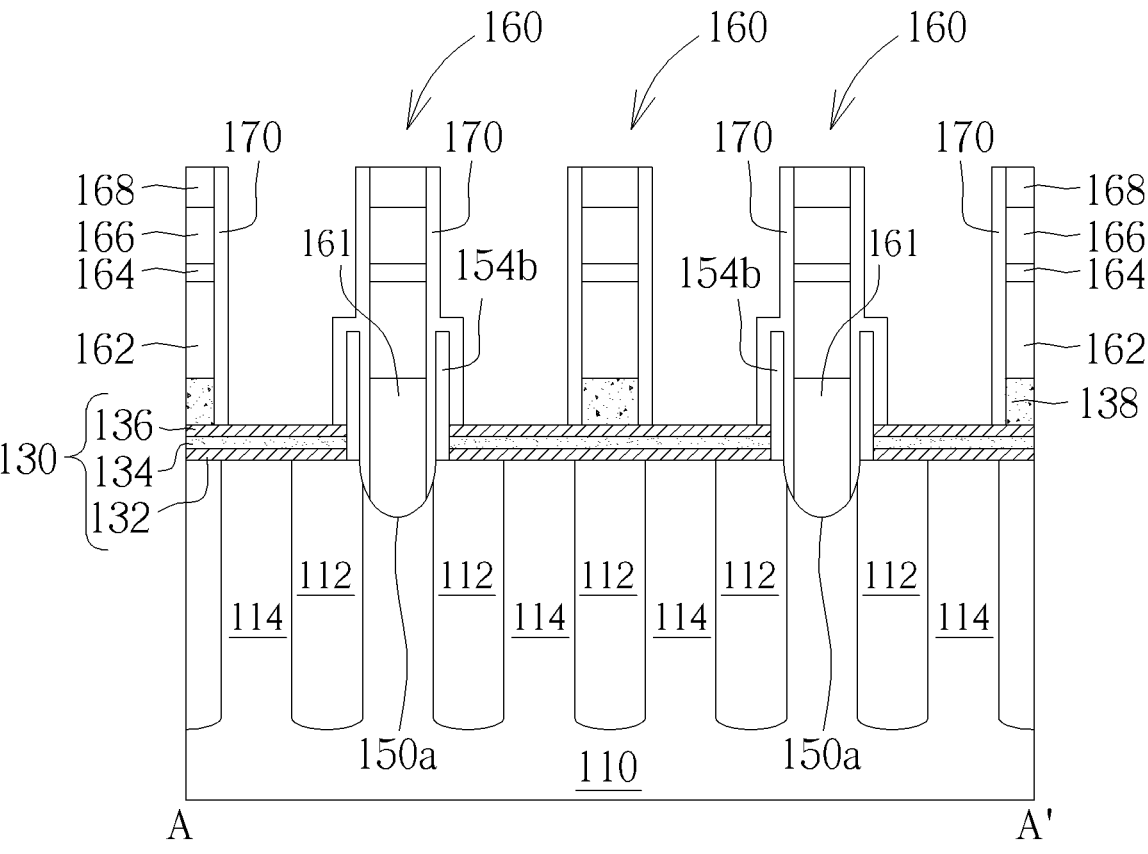

After that, as shown in FIG. 13 and FIG. 14, a deposition process and an etching back process are performed, to form a spacer 170 on sidewalls of each bit line 160, each bit line contact 161 and each second portion 154b, with the spacer 170 for example including a material like silicon oxide, silicon nitride, silicon oxynitride or silicon carbonitride. The spacer 170 may optionally include a monolayer structure as shown in FIG. 14 or a multilayer structure (not shown in the drawings), and the multilayer structure may include a first spacer (not shown in the drawings, such as including silicon nitride), a second spacer (not shown in the drawings, such as including silicon oxide), and a third spacer (not shown in the drawings, such as including silicon nitride) stacked in one over another, but not limited thereto. It is noted that, in the present embodiment, the spacer 170 preferably fills in the gap between each bit line 160 and each second portion 154b, but is not limited thereto. In another embodiment, the spacer 170 may be optionally filled in partial gap between each bit line 160 and each second portion 154b, or may be not filled in the gap between each bit line 160 and each second portion 154b, by adjusting the process conditions of the deposition process and the etching back process. Accordingly, a void (not shown in the drawings) may be formed within the spacer 170, or an air gap (not shown in the drawings) may be formed between each bit line 160 and each second portion 154b, for further isolating each bit line 160 and the conductive components formed between the adjacent bit lines 160 in the subsequent process. On the other hand, each first portion 154a of the liner layers 154 is still partially embedded in the bottom semiconductor layer 138 of each bit line 160, and partially embedded in the semiconductor layer 162 of each bit line 160, as shown in FIG. 12.

Figure 15:
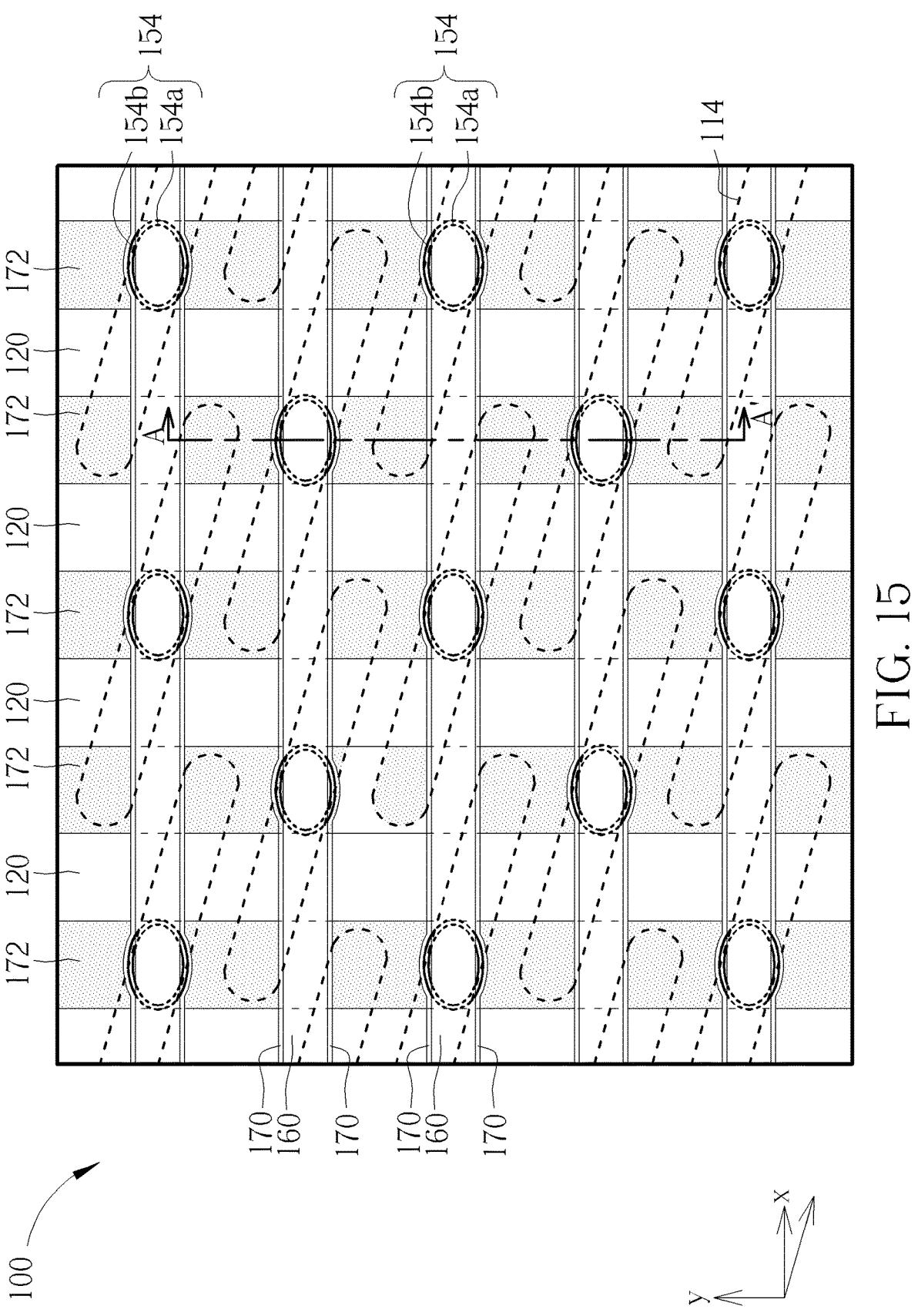
Figure 16:
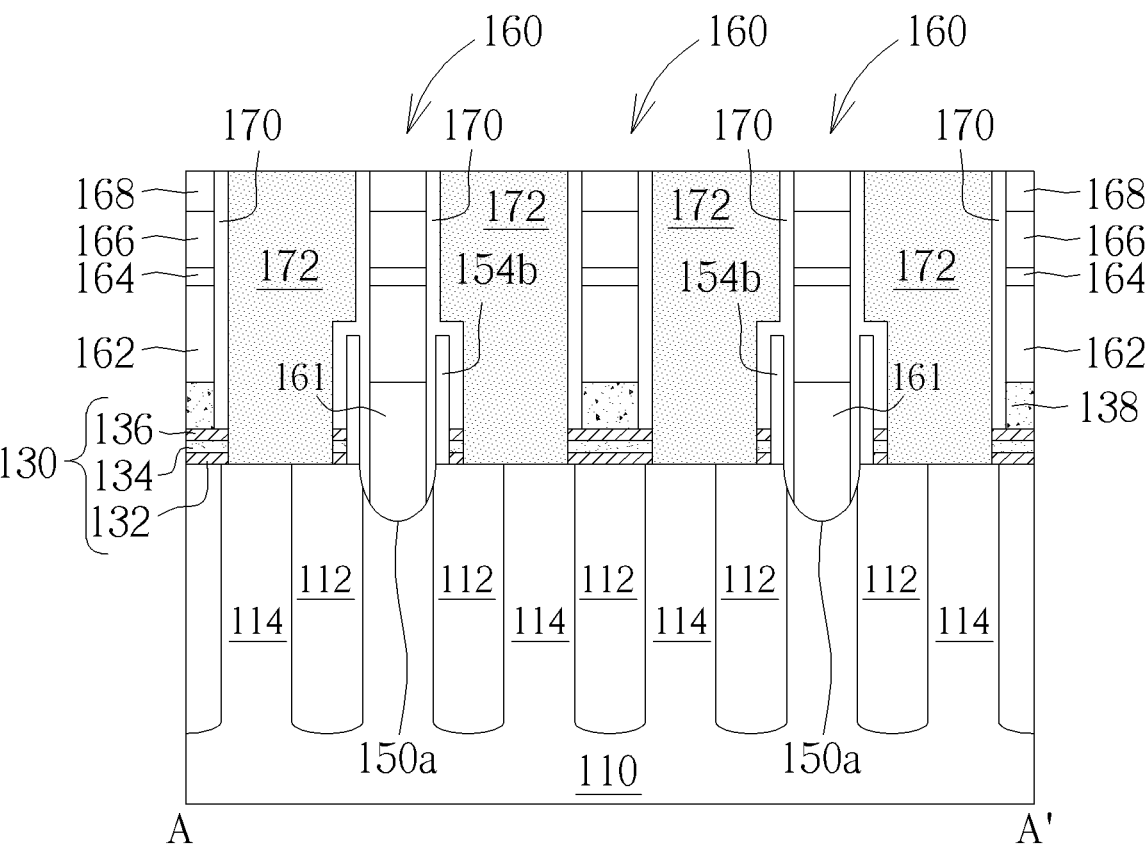

Following these, as shown in FIG. 15 and FIG. 16, a plurality of plugs 172 is formed, and each of the plugs 172 and each of the bit lines 160 are alternately disposed on the substrate 110, being isolating from each other through the spacer 170 disposed therebetween. Each plug 172 penetrates through the dielectric layer 130, to directly contact each active area 114 within the substrate 110, to serve as a storage node contact. In one embodiment, the plugs 172 for example include a low resistant metal material like aluminum, titanium, copper or tungsten, but not limited thereto. Also, the formation of the plugs 172 may be accomplished but not limited to the following process. Firstly, a dielectric material layer (not shown in the drawings, for example including a dielectric material like silicon oxide or silicon oxynitride) is filled in the space between the adjacent bit lines 160, and the dielectric material layer and the dielectric layer 130 are partially removed through another mask layer (not shown in the drawings) formed on the substrate, to form a plurality of plug openings (not shown in the drawings) between the adjacent bit lines 160, thereby exposing two ends of each active area 114. Then, a deposition process and an etching back process are sequentially performed, to form the plugs 172 in the plug openings, with each of the plugs 172 being extended into each plug opening to have a top surface being coplanar with the top surfaces of each bit line 160 and the spacer 170.

It is noted that, in the present embodiment, each second portion 154b of each liner layer 154 and the spacer 170 covered thereon are not being etched while forming the plug openings. Then, after forming the plugs 172, each second portion 154b of each liner layer 154 are still sandwiched between each plug 172 and each bit line 160 in the y-direction, as shown in FIG. 16. On the other hand, each first portion 154a of each liner layer 154 is still partially embedded in the bottom semiconductor layer 138 of each bit line 160, and partially embedded in the semiconductor layer 162 of each bit line 160, as shown in FIG. 12. In another embodiment, the formation of the plugs 172 may also be carried out through a self-aligned double patterning process or a self-aligned reverse patterning process, but not limited thereto. Furthermore, it is also noted that, a plurality of word-line isolating layers (not shown in the drawings, for example including a material like silicon nitride or silicon carbonitride) is formed on the substrate 110, before forming the plug openings in the present embodiment, to align with the word lines (namely the gate structure 120) in the substrate 110. That is, each second portion 154b of each liner layer 154 is disposed between two adjacent ones of the word-line isolating layers in the x-direction. In one embodiment, the word-line isolating layers for example include a material the same as that of the liner layer 154, but is not limited thereto.

Through the above processes, the fabrication of the semiconductor memory device 100 of the first embodiment in the present disclosure is accomplished. According to the fabricating method of the present embodiment, each liner layer 154 is additionally disposed on the sidewall of each contact opening 150a as shown in FIG. 5, to shrink the diameter of the contact openings 150a, and to improve the expansion issue of the contact opening 150a caused by over-etching. Furthermore, since the bit lines 160 and the bit line contacts 161 are formed after forming the liner layers 154, at least a portion (namely the first portion 154a) of each liner layer 154 is embedded in the bit lines 160, which is enable to protect each bit line contact 161 while patterning the bit lines 160. Precisely speaking, as shown in FIG. 12, each first portion 154a embedded in the bit line 160 is disposed between each bit line contact 161 and each bit line 160 in the extending direction (namely, the x-direction) of the bit lines 160. Also, as shown in FIG. 16, each liner layer 154 further includes the second portion 154*b*, and the second portion 154*b* is exposed after patterning the bit lines 160, being disposed between each bit line 160 and each plug 172 in the direction (namely the y-direction) normal to the bit lines 160. Accordingly, a memory component may be continuously formed in the subsequent process, with the memory component and the transistor together forming a dynamic random access memory (DRAM) device, but not limited thereto. The semiconductor memory device of the present disclosure includes the bit line contacts 161 with preferably structural reliability, and which can avoid the possible structural defects caused by continuously shrinking density of the memory cell formed in the subsequent process.

However, People in the art should fully realize that the semiconductor memory device and the fabricating method thereof are not limited to the aforementioned embodiment and may include other examples or may be achieved through other strategies to meet practical product requirements. For example, in one embodiment, each of the bit lines 160 may optionally include a metal bit line. The following description will detail the different embodiments of the semiconductor memory device and fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 17:
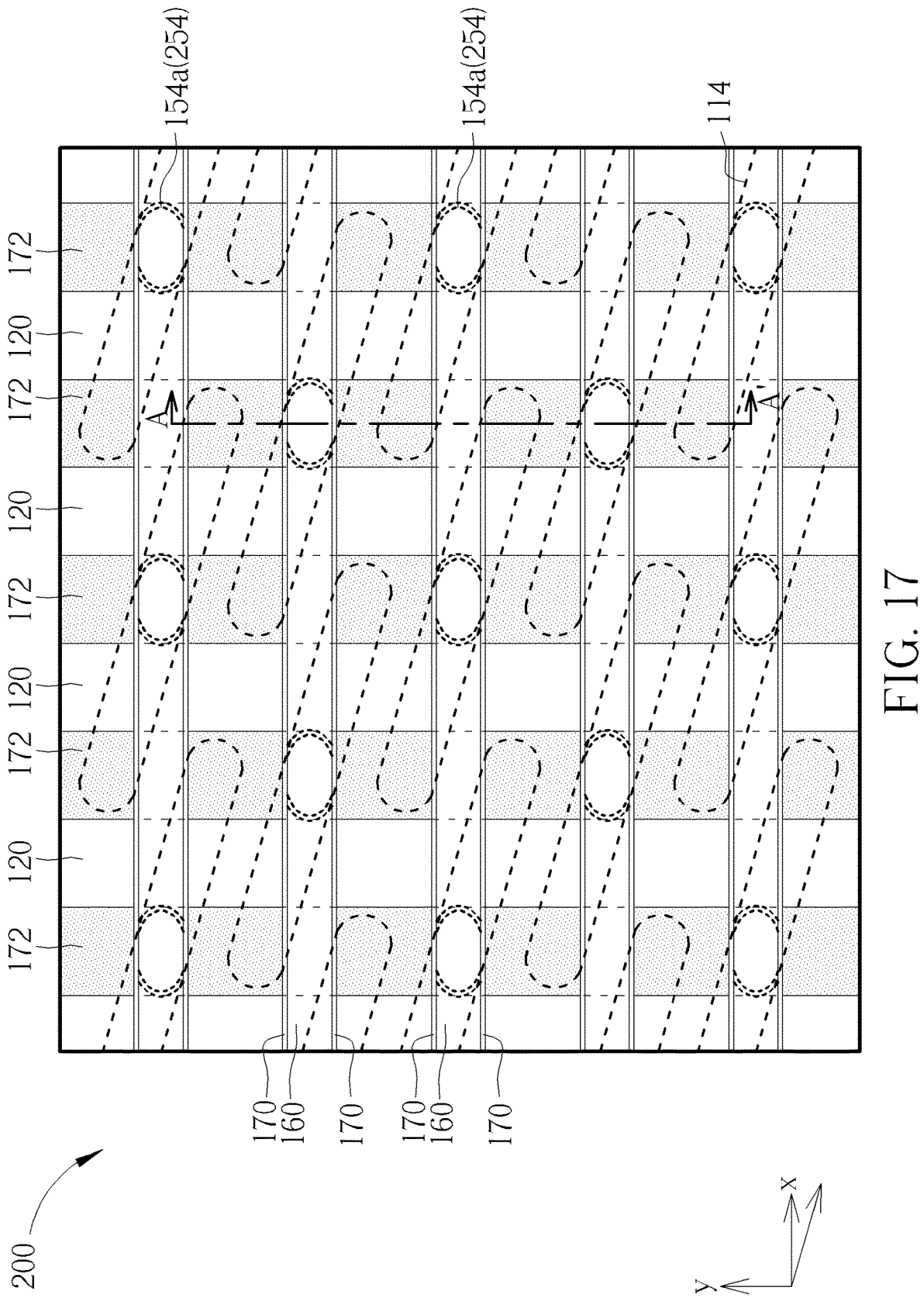
Figure 18:
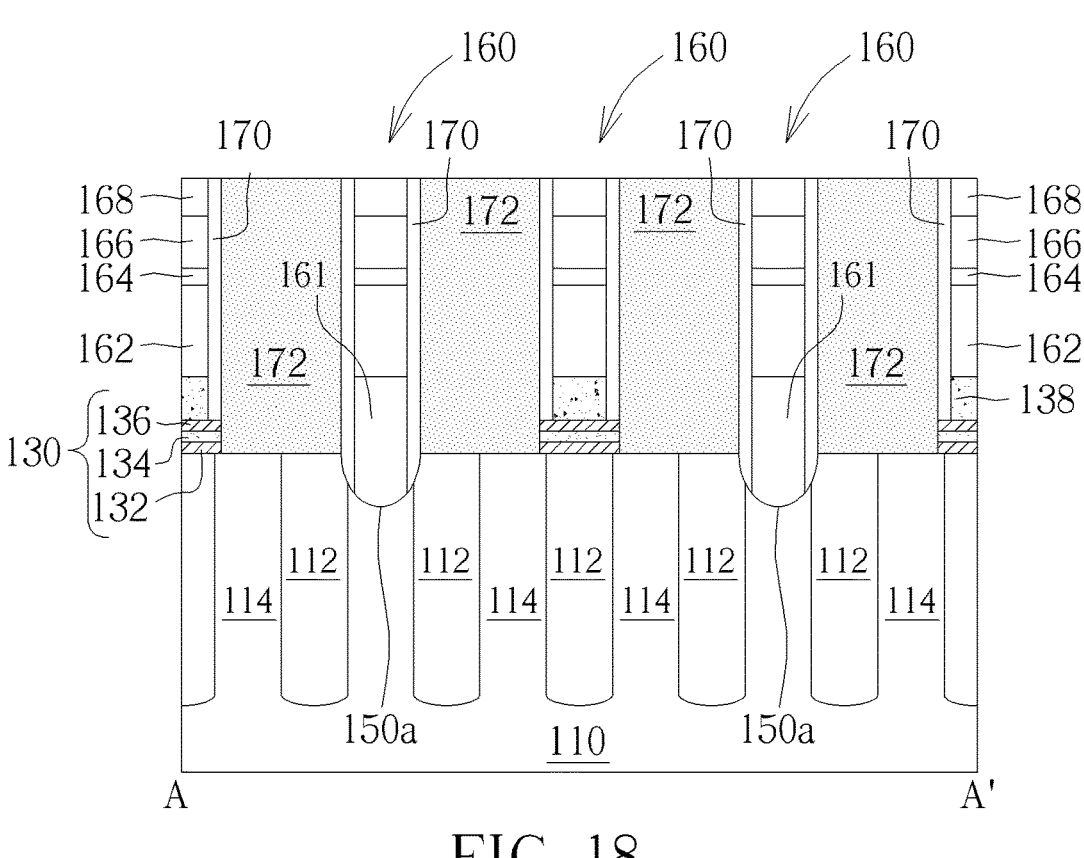

Please refer to FIG. 17 to FIG. 18, illustrating schematic diagrams of a fabricating method of a semiconductor memory device 200 according to the second embodiment in the present disclosure, wherein FIG. 17 shows a schematic top view of the semiconductor memory device 200 during the fabricating processes, and FIG. 18 show a cross-sectional view of the semiconductor memory device 200 during the fabricating processes. The forming processes of the present embodiment are substantially the same as the forming processes of the aforementioned first embodiment as shown in FIG. 1 to FIG. 16, and the similarities will not be redundantly described hereinafter. The difference between the present embodiment and the aforementioned first embodiment is mainly in that each liner layer 254 of the present embodiment only includes the first portion 154*a* embedded in each bit line 160.

Precisely speaking, as shown in FIG. 17 to FIG. 18, while forming a plurality of plug openings (not shown in the drawings) by partially removing the dielectric material layer and the dielectric layer 130, each second portion 154*b* as shown in FIG. 10 to FIG. 11 of the aforementioned embodiment and the spacer 170 covering thereon are simultaneously removed. On the other hand, each first portion 154*a* is still partially embedded in the bottom semiconductor layer 138 of each bit line 160, and partially embedded in the semiconductor layer 162 of each bit line 160, as shown in FIG. 12 of the aforementioned embodiment. Accordingly, only the spacer 170 is disposed between each plug openings and each bit line 160 in the present embodiment. Then, after forming the plugs 172, there is only the spacer 170 disposed between each plug openings and each bit line 160, as shown in FIG. 18.

Through the above processes, the fabrication of the semiconductor memory device 200 of the second embodiment in the present disclosure is accomplished. According to the fabricating method of the present embodiment, although each liner layer 254 only includes the first portion 154*a* embedded in each bit line 160, which also enables to shrink the diameter of the contact openings 150*a* as shown in FIG. 5, thereby improving the expansion issue of the contact openings 150*a* caused by over-etching, and protecting each bit line contact 161 while patterning the bit lines 160. Accordingly, a memory component may be continuously formed in the subsequent process, with the memory component and the transistor together forming a dynamic random access memory (DRAM) device, but not limited thereto. The semiconductor memory device of the present disclosure includes the bit line contacts 161 with preferably structural reliability, and which can avoid the possible structural defects caused by continuously shrinking density of the memory cell formed in the subsequent process.

Figure 19:
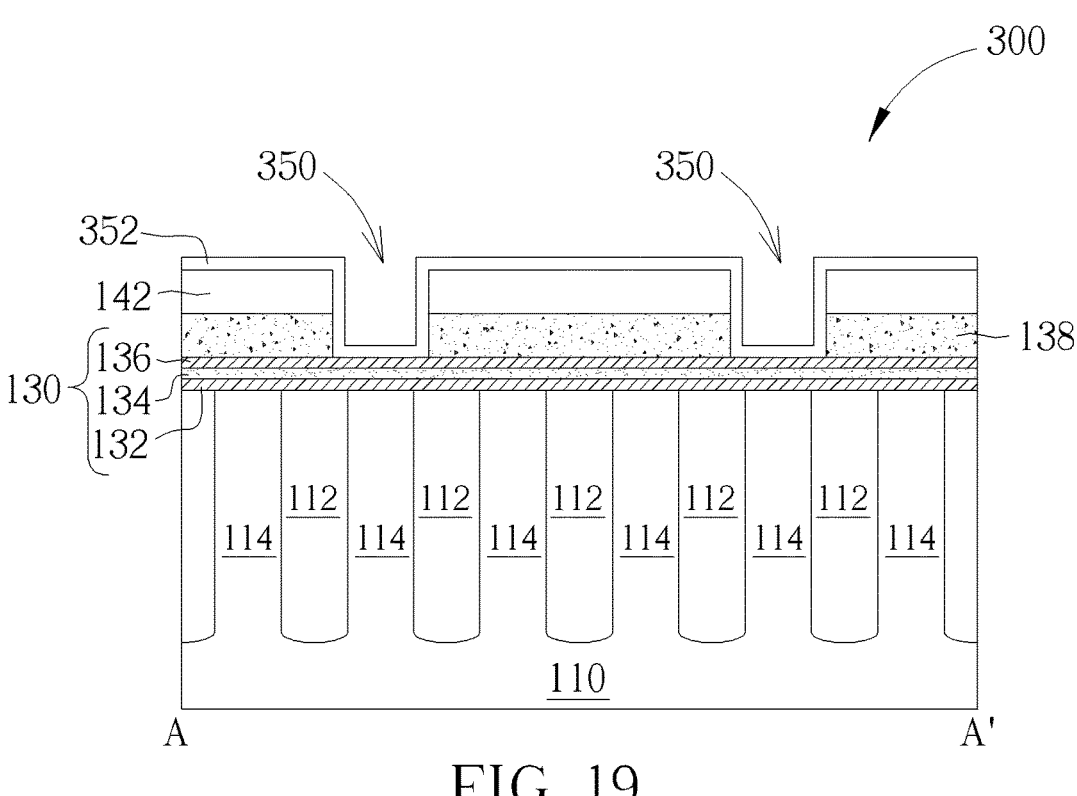
FIG. 19 is a schematic diagram illustrating a fabricating method of a semiconductor memory device according to a third embodiment in the present disclosure.

Please refer to FIG. 19, illustrating a schematic diagram of a fabricating method of a semiconductor memory device 300 according to the third embodiment in the present disclosure. The forming processes of the present embodiment are substantially the same as the forming processes of the aforementioned first embodiment, and the similarities will not be redundantly described hereinafter. The difference between the present embodiment and the aforementioned first embodiment is mainly in that liner layers (not shown in the drawings) are formed on the surface of the dielectric layer 130, without directly contacting the shallow trench isolation 112 of the substrate 110.

Precisely speaking, as shown in FIG. 19, while performing the etching process through the patterned photoresist layer 146 as shown in FIG. 1 and FIG. 2, the pattern 148 of the patterned photoresist layer 146 is only transferred into the silicon containing hard mask layer 144, the sacrificial layer 142, and the bottom semiconductor layer 138 underneath, to form a plurality of openings 350 as shown in FIG. 19 to align with each active area 114 respectively. Also, after forming the openings 350, the patterned photoresist layer 146 and the silicon containing hard mask layer 144 are completely removed. Next, further in view of FIG. 19, a liner material layer 352 is formed on the substrate 110, to conformally cover the exposed surfaces of the sacrificial layer 142, the bottom semiconductor layer 138 and the openings 350. Then, through performing the subsequent processes as shown in FIG. 4 to FIG. 16 of the aforementioned first embodiment, a plurality of liner layers (not shown in the drawings) may be formed to directly contact the top surface of the dielectric layer 130, at the outer periphery of the bit line contacts 161 as shown in FIG. 6. The liner layers may optionally include both the first portion 154*a* and the second portion 154*b* as mentioned in the aforementioned first embodiment, or only include the second portion 154*b* as mentioned in the aforementioned second embodiment.

Through the above processes, the fabrication of the semiconductor memory device 300 of the third embodiment in the present disclosure is accomplished. According to the fabricating method of the present embodiment, the liner layers of the present embodiment re directly disposed on the dielectric layer 130, to also shrink the diameter of the contact openings 150*a* as shown in aforementioned FIG. 5, thereby improving the expansion issue of the contact openings 150*a* caused by over-etching, and protecting the bit line contacts 161 while patterning the bit lines 160 as shown in aforementioned FIG. 10 to FIG. 12. Accordingly, a memory component may be continuously formed in the subsequent process, with the memory component and the transistor together forming a dynamic random access memory device, but not limited thereto. The semiconductor memory device 300 of the present disclosure includes the bit line contacts 161 with preferably structural reliability, and which can avoid the possible structural defects caused by continuously shrinking density of the memory cell formed in the subsequent process.

Overall speaking, based on the fabricating method of the present disclosure, the liner layer is additionally disposed on sidewalls of each contact opening, to shrink the diameter of each contact opening, thereby improving the expansion issue of the contact opening caused by over-etching. Also, since the bit lines and the bit line contacts are formed after forming the liner layer, the liner layer enables to protect each bit line contact while forming the bit lines through a patterning process. Accordingly, the fabricating method of the present disclosure is allowable to form a semiconductor memory device with more reliable components, to effectively avoid the possible structural defects caused by continuously shrinking density of the components.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
a substrate, comprising a plurality of active areas and a shallow trench isolation;
a plurality of bit lines, separately disposed on the substrate;
a bit line contact, disposed below one of the bit lines to extend into one of the active areas;
a spacer, disposed on sidewalls of the bit lines and the bit line contact;
a liner layer, disposed on the substrate along an outer periphery of the bit line contact, wherein the liner layer comprises a first portion embedded in the one of the bit line, and the first portion is disposed between the bit line contact and the one of the bit lines in an extending direction of the bit lines; and
a storage node contact, disposed on the one of the active areas, the storage node contact and the bit lines are alternately arranged with each other.

2. The semiconductor memory device according to claim 1, wherein the liner layer further comprises a second portion disposed between the bit line contact and the storage node contact.

3. The semiconductor memory device according to claim 2, wherein a portion of the spacer is disposed on the second portion.

4. The semiconductor memory device according to claim 1, wherein the liner layer directly contacts the shallow trench isolation in the substrate.

5. The semiconductor memory device according to claim 1, further comprising:
a dielectric layer, disposed on the substrate, between the bit lines and the substrate, wherein the liner layer directly contacts a top surface of the dielectric layer.

6. The semiconductor memory device according to claim 2, wherein the liner layer is disposed around the bit line contact, and includes an insulating material which is different from that of the shallow trench isolation.

7. The semiconductor memory device according to claim 1, wherein each of the bit lines comprises a bottom semiconductor layer, a barrier layer and a conductive layer stacked sequentially from bottom to top, and a top surface of the liner layer is higher than a top surface of the bottom semiconductor layer of each of the bit lines.

8. The semiconductor memory device according to claim 2, wherein a top surface of the first portion is higher than a top surface of the second portion.

9. A semiconductor memory device, comprising:
a substrate, comprising a plurality of active areas and a shallow trench isolation;
a plurality of bit lines, separately disposed on the substrate, each of the bit lines comprises a conductive layer and a capping layer stacked from bottom to top, and a top portion of the capping layer comprises a plurality of protrusions;
a bit line contact, disposed below one of the bit lines to extend into one of the active areas, wherein one of the protrusions is disposed around the bit line contact;
a spacer, disposed on sidewalls of each of the bit lines and the bit line contact; and
a storage node contact, disposed on the one of the active areas, the storage node contact and the bit lines are alternately arranged with each other.

10. The semiconductor memory device according to claim 9, further comprising:
a liner layer, disposed on the substrate along an outer periphery of the bit line contact, wherein the one of the protrusions overlaps the liner layer.

11. The semiconductor memory device according to claim 10, wherein the liner layer is partially embedded in the one of the bit lines.

12. The semiconductor memory device according to claim 10, wherein the liner layer is partially sandwiched between the spacer disposed on the bit line contact and the storage node contact.

13. A method of fabricating a semiconductor memory device, comprising:
providing a substrate, comprising a plurality of active areas and a shallow trench isolation;
forming a plurality of bit lines separately disposed on the substrate;
forming a bit line contact below one of the bit lines, the bit line contact being extended into one of the active areas;
forming a spacer on sidewalls of each of the bit lines and the bit line contact;
forming a liner layer on the substrate along an outer periphery of the bit line contact, wherein the liner layer comprises a first portion embedded in the one of the bit line, and the first portion is disposed between the bit line contact and the one of the bit lines in an extending direction of the bit lines; and
forming a storage node contact on the one of the active areas, the storage node contact and the bit lines are alternately arranged with each other.

14. The method of fabricating the semiconductor memory device according to claim 13, wherein the liner layer further comprises a second portion disposed between the bit line contact and the storage node contact.

15. The method of fabricating the semiconductor memory device according to claim 13, further comprising:
forming a dielectric layer on the substrate;
forming a sacrificial layer on the dielectric layer, the sacrificial layer comprising an opening formed therein;
forming a liner material layer on the substrate, covering the sacrificial layer and a surface of the opening;
partially removing the substrate, to form a contact opening in the substrate; and partially removing the liner material layer, to form the liner layer.

16. The method of fabricating the semiconductor memory device according to claim 15, wherein after partially removing the dielectric layer, forming the liner material layer.

17. The method of fabricating the semiconductor memory device according to claim 15, wherein before partially removing the dielectric layer, forming the liner material layer.

18. The method of fabricating the semiconductor memory device according to claim 15, further comprising:

forming a dielectric material layer on the substrate, to fill in a space between each of the bit lines;

partially removing the dielectric material layer, to form a plurality of plug openings, to exposed each of the active areas; and forming the storage node contact in each of the plug openings.

19. The method of fabricating the semiconductor memory device according to claim 18, further comprising:

while forming the plug openings, removing the second portion of the liner layer between the bit line contact and the storage node contact, wherein the liner layer comprises a material the same as that of the shallow trench isolation.

20. The method of fabricating the semiconductor memory device according to claim 14, further comprising:

forming a plurality of word lines in the substrate; and forming a plurality of word-line isolating layers on the substrate to aligned with each of the word lines, wherein the second portion of the liner layer is formed between adjacent ones of the word-line isolating layer, and comprises a material the same as that of the word-line isolating layer.

* * * * *